(12) United States Patent
Nakamura

(10) Patent No.: US 11,329,419 B2
(45) Date of Patent: May 10, 2022

(54) INSPECTION SOCKET

(71) Applicant: Yamaichi Electronics Co., Ltd., Tokyo (JP)

(72) Inventor: Yuji Nakamura, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 17/110,623

(22) Filed: Dec. 3, 2020

(65) Prior Publication Data

US 2021/0175658 A1 Jun. 10, 2021

(30) Foreign Application Priority Data

Dec. 10, 2019 (JP) .............................. JP2019-222926

(51) Int. Cl.
*H01R 13/512* (2006.01)
*G01R 31/28* (2006.01)
(Continued)

(52) U.S. Cl.
CPC ....... *H01R 13/512* (2013.01); *G01R 31/2886* (2013.01); *H01R 13/6461* (2013.01);
(Continued)

(58) Field of Classification Search
CPC ............... H01R 13/512; H01R 12/714; H01R 13/6461; H01R 13/6473; H01R 33/7664;
(Continued)

(56) References Cited

U.S. PATENT DOCUMENTS 8,911,266 B2 * 12/2014 Kawate .............. H01R 13/6596
439/700
10,534,033 B2 * 1/2020 Nakamura ............. G01R 1/045
(Continued)

FOREIGN PATENT DOCUMENTS

JP 2006300581 A 11/2006
JP 2017-076587 A 4/2017
(Continued)

OTHER PUBLICATIONS

Extended European Search Report, for European Patent Application No. 20210048.3, entitled "Inspection Socket", published on Jun. 30, 2021.

*Primary Examiner* — Renee S Luebke
*Assistant Examiner* — Paul D Baillargeon
(74) *Attorney, Agent, or Firm* — Hamilton, Brook, Smith & Reynolds, P.C.

(57) ABSTRACT

The inspection socket includes: a contact terminal 80 including a barrel 82 having a flange section 90, a device-side terminal 84, and a board-side terminal 86; housings 10, 30, and 50 having through holes 10c, 30c, and 50c into which the contact terminal 80 is inserted; and housings 20 and 40 having through holes 20c and 40c into which the contact terminal 80 is inserted, the through holes 20c and 40c being larger than the outer diameter of the contact terminal 80 excluding the flange section 90 and smaller than the outer diameter of the flange section 90. The housings 20 and 40 are sandwiched between the housings 10, 30, and 50, the flange section 90 is contained in the through hole 50c, and the through holes 10c, 30c, and 50c are designed to have, for impedance matching, a gap from the outer periphery of the contact terminal 80.

6 Claims, 22 Drawing Sheets

(51) Int. Cl.
   *H01R 13/6461* (2011.01)
   *H01R 33/76* (2006.01)
   *H01R 13/436* (2006.01)
   *H01R 13/6473* (2011.01)

(52) U.S. Cl.
   CPC ..... *H01R 33/7664* (2013.01); *H01R 33/7685* (2013.01); *H01R 13/4367* (2013.01); *H01R 13/6473* (2013.01); *H01R 2201/20* (2013.01)

(58) Field of Classification Search
   CPC ............ H01R 33/7685; H01R 13/4367; G01R 31/2886
   See application file for complete search history.

(56) References Cited

U.S. PATENT DOCUMENTS

| | | |
|---|---|---|
| 2010/0007365 A1 | 1/2010 | Ishizuka |
| 2010/0267291 A1 | 10/2010 | Chabineau-Lovgren et al. |
| 2011/0221464 A1 | 9/2011 | Nagata |
| 2018/0238957 A1 | 8/2018 | Nakamura et al. |
| 2019/0302144 A1 | 10/2019 | Nakamura et al. |

FOREIGN PATENT DOCUMENTS

| | | |
|---|---|---|
| JP | 2019-178947 A | 10/2019 |
| WO | 2018078946 A1 | 5/2018 |

\* cited by examiner

INSPECTION SOCKET

RELATED APPLICATIONS

This application claims priority under 35 U.S.C. § 119 or 365 to Japanese, Application No. 2019-222926, filed Dec. 10, 2019. The entire teachings of the above application are incorporated herein by reference.

TECHNICAL FIELD

The present invention relates to an inspection socket.

BACKGROUND ART

Electronic devices such as IC packages mounted on electronic equipment are generally tested using inspection sockets to remove potential defects before they are mounted on wiring boards. Inspection sockets are mounted on printed wiring boards (inspection boards) which are test boards or mounting boards.

When an inspection socket is provided in a transmission path for transmission of a radio frequency (RF) signal supposed to be at 10 to 100 GHz, for example, impedance matching is usually performed in the inspection socket in order to enhance the performance of transmitting high-frequency signals. For this reason, as in PTL 1, for example, a coaxial inspection socket is used. To be specific, an air layer is formed between a contact terminal and a through-hole in a metal block into which the contact terminal is inserted, thereby forming a coaxial structure that has a signal contact terminal as a core conductor and an inner wall defining the through-hole as an outer conductor.

CITATION LIST

Patent Literature

[PTL 1] Japanese Unexamined Patent Application, Publication No. 2019-178947

SUMMARY OF INVENTION

Technical Problem

In the configuration disclosed in PTL 1 (FIG. 3 of PTL 1, for example), the housing is brought into contact with the shoulder portion (end portion on the IC package side) of the barrel so that a preload is loaded. In addition, another housing is laminated on the housing. Hence, in order to bring the tip of the plunger into contact with the solder ball of the electronic device, the dimensions of the plunger should be adjusted in consideration of the thickness of the housing to be brought into contact with the shoulder of the barrel and the other housing laminated on the housing.

When the plunger is long, the transmission path is long, which may affect signal attenuation. Further, since the longer the plunger, the higher the heat value, the allowable current may decrease. Besides, the deflection due to the inclination of the plunger becomes significant, which may affect the concentric accuracy. If the solder ball is forcibly brought into contact with the plunger out of a fixed position, the plunger may be damaged.

In the configuration disclosed in PTL 1 (FIG. 10 of PTL 1), the contact terminal may be inclined during assembly, which may hinder the assembly of the housing. Note that the inspection socket is assembled with the contact terminal and housing upside down.

Besides, in any of the above configurations, the thickness of the housing to be brought into contact with the shoulder of the barrel and the other housing laminated on the housing is small, the reaction force of the preload may cause convex warpage in the center of each housing. If warpage occurs, the holes that guide the solder balls may be out of position and the electronic device may be damaged. For instance, electronic devices such as CPUs and GPUs have many contact terminals (for example, 2000 or more) are more likely to have warpage because the load acting on the housing (preload reaction force) is proportional to the number of contact terminals. Aside from that, if the thickness of the housing located above the shoulder of the barrel is made large in order to suppress the warpage, the plunger inevitably becomes long, which causes the problems of signal attenuation, concentric accuracy, and allowable current.

For this reason, an object of the present invention is to provide an inspection socket that has a coaxial structure in which warpage in the housing can be suppressed and the plunger can be made shorter, and high assemblability is offered.

Solution to Problem

In order to solve the aforementioned problems, the inspection socket of the present invention adopts the following solutions.

In particular, an inspection socket according to one aspect of the present invention includes: a contact terminal that includes: a barrel that consists of a tube body extending in an axial direction and has a flange section where a part, extending in the axial direction, of the outer periphery of the tube body radially protrudes, a device-side terminal provided at one end of the barrel, and a board-side terminal provided at the other end of the barrel; metal housings each of which has a through hole into which the contact terminal is inserted in the axial direction, the through hole has a larger inner diameter than at least the flange section of the barrel; and a resin alignment board that has a positioning hole into which the contact terminal is inserted in the axial direction, an inner diameter of the positioning hole being larger than the outer diameter of the contact terminal excluding the flange section and smaller than the outer diameter of the flange section. The metal housings are disposed, at least, on the board-side terminal side and the device-side terminal side and between the board-side terminal and the device-side terminal, the alignment board is sandwiched between the metal housings, the flange section is contained in the through hole formed in the metal housing on the board-side terminal side, and the through hole is designed to have, for impedance matching, a gap from the outer periphery of the contact terminal.

According to the inspection socket according to this aspect, when the contact terminal is contained in at least three metal housings and an alignment board sandwiched between the metal housings, the flange section formed on the barrel of the contact terminal is contained in the through holes formed in the metal housing on the inspection board side. At this time, the positioning hole formed in the alignment board laminated on the metal housing on the inspection board side is larger than the outer diameter of the contact terminal excluding the flange section and smaller than the outer diameter of the flange section, so that the flange section can be brought into contact with the alignment board on the inspection board side. As a result, when the inspection socket is populated on the board, the contact terminal is pushed by the alignment board, which is located on the inspection board side, via the flange section, so that the contact terminal is preloaded. At this time, the reaction force of the preload acts on the alignment board (alignment board on the inspection board side) in contact with the flange section. However, the alignment board on the inspection board side can be pressed by another metal housing or another alignment board laminated on the alignment board on the inspection board side; thus, warpage in the alignment board adjacent to the inspection board in contact with the flange section can be suppressed.

Moreover, preloading the contact terminal (flange section) through the alignment board on the inspection board side eliminates the need for preloading the shoulder portion of the barrel from the device side. The alignment board for pushing the barrel from the device side is therefore unnecessary, and the device-side terminal can be shortened accordingly. Consequently, the attenuation of the transmission signal can be suppressed. Moreover, since the heat value is reduced, the allowable current can be improved. Further, the deflection due to the inclination of the device-side terminal is reduced, so that the concentric accuracy can be improved.

Also, for assembling the inspection socket upside down, the contact terminal can be aligned through the positioning hole while hanging from the alignment board through the flange section, thereby facilitating the assembly of the inspection socket and maintenance (for example, replacement of the contact terminals).

Since the conductive metal housing is adopted, crosstalk between one contact terminal and another contact terminal can be reduced. For this reason, even if the impedance of the contact terminal is slightly lowered due to the formation of the flange section, its influence on the inspection socket as a whole can be suppressed.

Note that the inspection socket of this aspect is an inspection socket with a so-called coaxial structure in which a gap (dielectric layer) for impedance matching is set between the outer periphery of the contact terminal and the metal housing. The dielectric layer may be a mere gap (air) or composed of a substance such as a resin or ceramic.

Further, in the inspection socket according to one aspect of the present invention, the flange section has a tapered portion.

In the inspection socket according to this aspect, the impedance mismatch that may occur in the contact terminal due to the formation of the flange section can be minimized. This is particularly useful for the contact terminal for a signal line where the influence of impedance mismatch should be eliminated.

Further, in the inspection socket according to one aspect of the present invention, the flange section has a cut surface having an outer diameter approximately equal to that of the barrel.

In the inspection socket according to this aspect, the impedance mismatch that may occur in the contact terminal due to the formation of the flange section can be minimized. This is particularly useful for the contact terminal for a signal line where the influence of impedance mismatch should be eliminated.

Note that the cut surface may have one face or multiple faces which are preferably provided symmetrically to the axis so as to come into contact with the alignment board with an even force. When there are many cut surfaces, the area of the contact portion is small and the surface pressure is high. For this reason, the cut surface preferably has two to six faces.

Further, in the inspection socket according to one aspect of the present invention, a portion of the gap used for impedance matching and overlapping the flange section has a larger diameter than the other portion.

In the inspection socket according to this aspect, the impedance mismatch that may occur in the contact terminal due to the formation of the flange section can be minimized. This is particularly useful for the contact terminal for a signal line where the influence of impedance mismatch should be eliminated.

Note that it is not necessary to form a large-diameter portion overlapping the flange section, in the impedance matching gap overlapping a portion of the flange section of the contact terminal other than the portion for a signal line (for example, for a ground line or power supply line).

Further, in the inspection socket according to one aspect of the present invention, the metal housing has a plurality of split housings laminated in the axial direction.

In the inspection socket according to this aspect, the large-diameter portion can be easily provided only in the middle layer of the metal housing. In other words, the large-diameter portion adjusted to the position of the flange section can be easily processed. This is useful for inspection sockets that employ so-called one-sided sliding type contact terminals.

Further, in the inspection socket according to one aspect of the present invention, the contact terminal is used for a signal line.

In the inspection socket according to this aspect, a flange section can be provided to the contact terminal for the signal line.

If a flange section is provided to the contact terminal for the signal line in the inspection socket having a coaxial structure, the impedance may drop. For this reason, it is usually difficult to positively adopt a flange for a contact terminal for a signal line. However, since crosstalk is reduced using a metal housing, a gap for impedance matching (large-diameter gap) overlapping the flange section is provided, and the shape of the flange is contrived (a tapered portion and a cut surface are provided), warpage in the housing can be suppressed while the influence of a decrease in impedance is suppressed, the plunger can be shortened, and the inspection socket can exhibit high assemblability.

Advantageous Effects of Invention

The present invention provides an inspection socket that has a coaxial structure, can suppress warpage in the housing and make the plunger shorter, and offers high assemblability.

DESCRIPTION OF EMBODIMENTS

First Embodiment

An inspection socket according to the first embodiment of the present invention will now be described with reference to the accompanying drawings.

The outline of an inspection socket 1 (hereinafter, simply referred to as "socket 1") will be described below.

Figure 1:
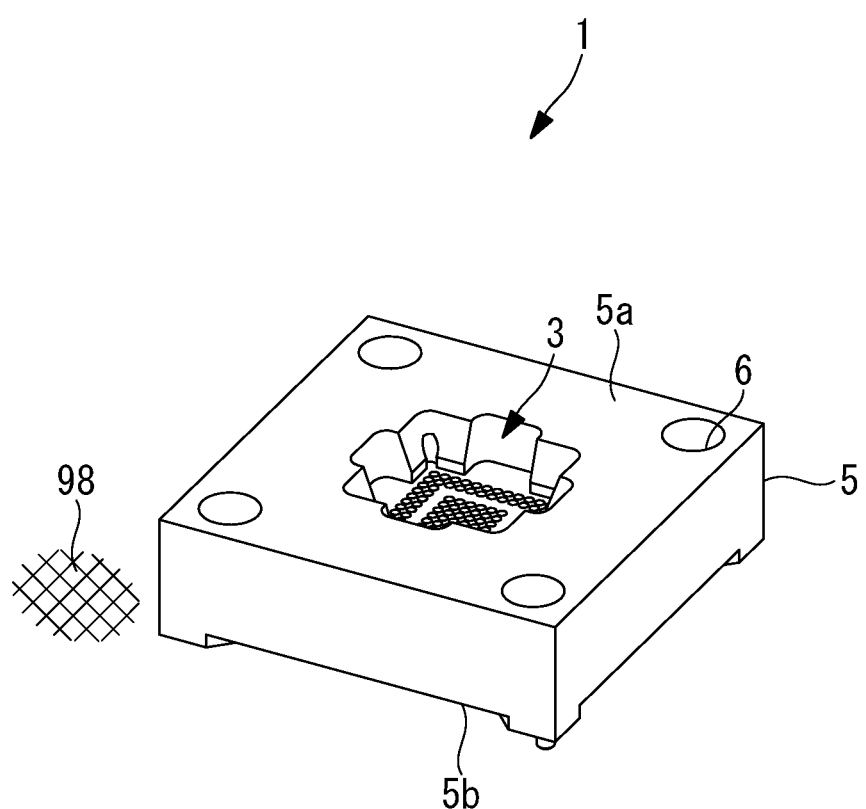
FIG. 1 is a perspective view of an inspection socket.

FIG. 1 shows the socket 1. The socket 1 is disposed and populated on, for example, a printed wiring board 98 (inspection board 98) as a test board. The socket 1 has a recess 3 in the center, and an inspection device (not shown in the drawing) such as an IC package is supposed to be inserted and installed in the recess 3.

The IC package has a ball grid array (BGA) shape as in this embodiment. Other IC packages have, for example, a land grid array (LGA) shape or a quad flat non-leaded package (QFN) shape.

Figure 2:
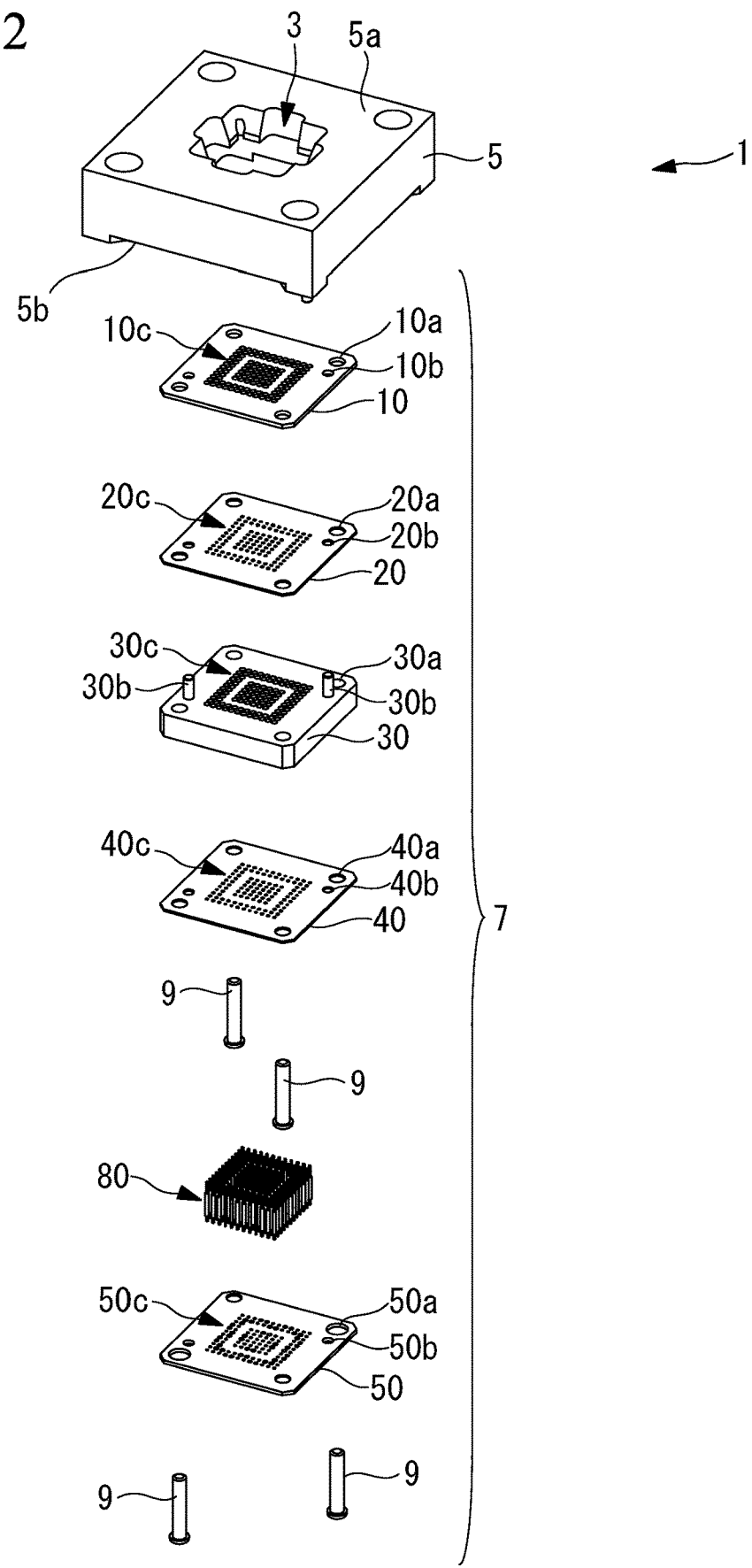
FIG. 2 is an exploded perspective view of the inspection socket in FIG. 1.
Figure 3:
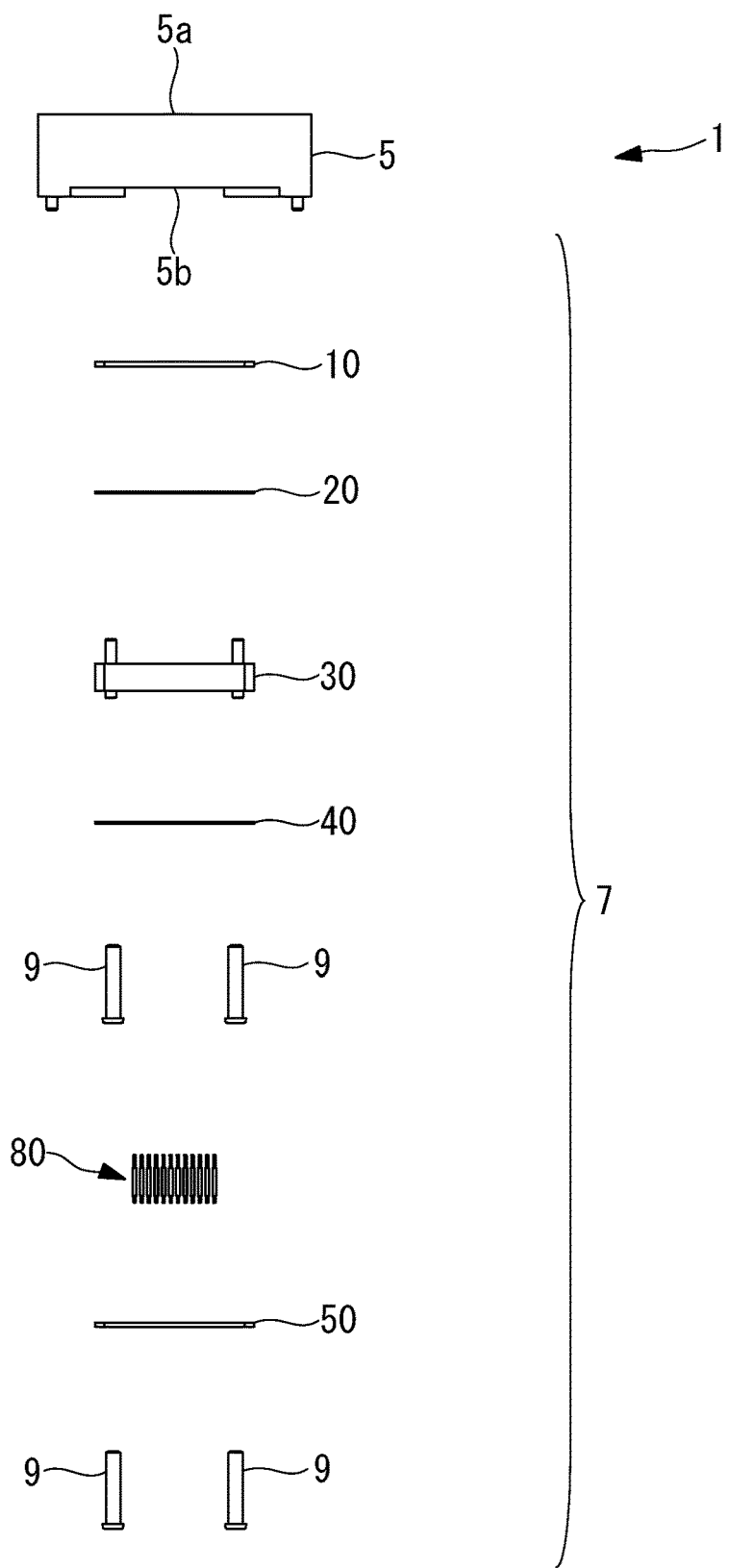
FIG. 3 is a side view of an inspection socket corresponding to that in FIG. 2.

As shown in FIGS. 2 and 3, the socket 1 includes a socket base 5, a housing 7, and a contact terminal 80.

As shown in FIGS. 1 to 4, the socket base 5 is a component that constitutes the outer shape of the socket 1. The socket base 5 is a rectangular parallelepiped having a generally square upper surface 5a and bottom surface 5b. The socket base 5 is made of a metal such as an aluminum alloy and has conductivity.

As shown in FIG. 1 or 2, the socket base 5 has a recess 3 in the central portion of the upper surface 5a. The recess 3 is recessed from the upper surface 5a toward the bottom surface 5b, and is generally square in a plan view. The recess 3 is a space for containing the inspection device.

Figure 4:
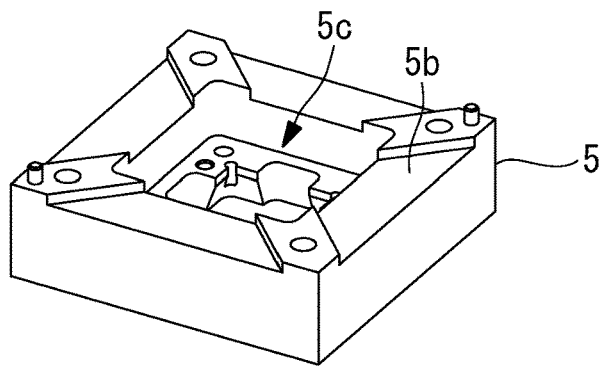
FIG. 4 is a rear perspective view of a socket base.

As shown in FIG. 4, the socket base 5 has a container recess 5c on the bottom surface 5b. The container recess 5c is recessed from the bottom surface 5b toward the upper surface 5a, and is generally square in a bottom view. The container recess 5c is a space for fixing the housing 7. The container recess 5c communicates with the aforementioned recess 3 (see FIG. 1 or 2). Hence, as shown in FIG. 1, the upper surface of the housing 7 (specifically, the first housing 10 described later) fixed in the container recess 5c is exposed on the bottom of the recess 3.

As shown in FIG. 1, the socket base 5 has a populating screw hole 6, which is used for populating, at each of the four corners. The socket 1 is configured to be populated on the inspection board 98 by cutting male threads in the populating screw holes 6 and fixing them to the inspection board 98 while the housing 7 and the contact terminal 80 are contained in the socket base 5.

As shown in FIGS. 2 and 3, in this embodiment, the housing 7 consists of five parts: first to fifth housings (metal housings) 10 to 50. The housing 7 is a holder member that holds a plurality of contact terminals 80.

The housing 7 has a laminated structure in which a plurality of plate members are laminated in the vertical direction (plate thickness direction): the first housing 10, the second housing (alignment board) 20, the third housing (metal housing) 30, the fourth housing (alignment board) 40, and the fifth housing 50 are provided from top to bottom in the drawing.

A housing fixing thread 9 and a contact terminal 80 are provided so that they pass through the first housing 10 to the fifth housing 50.

The contact terminal 80 will now be described before detailed description of the housing 7.

Figure 5:
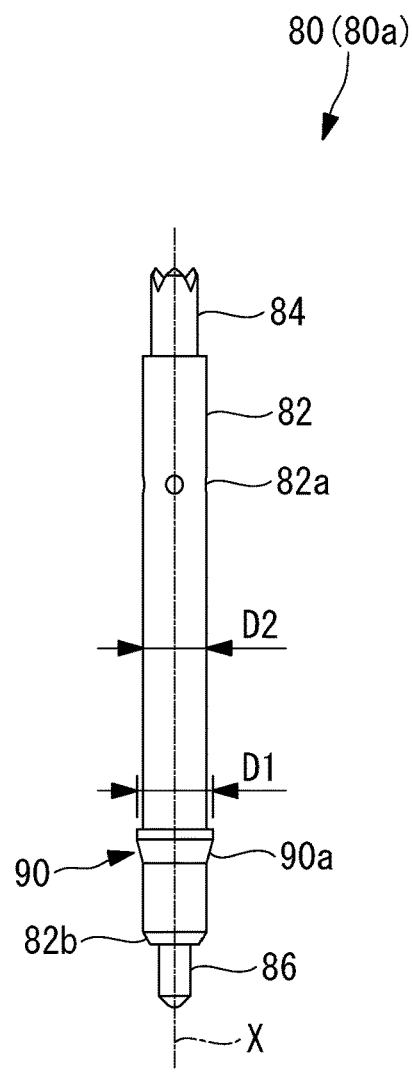
FIG. 5 is a side view of a contact terminal for a signal line according to a first embodiment.
Figure 6:
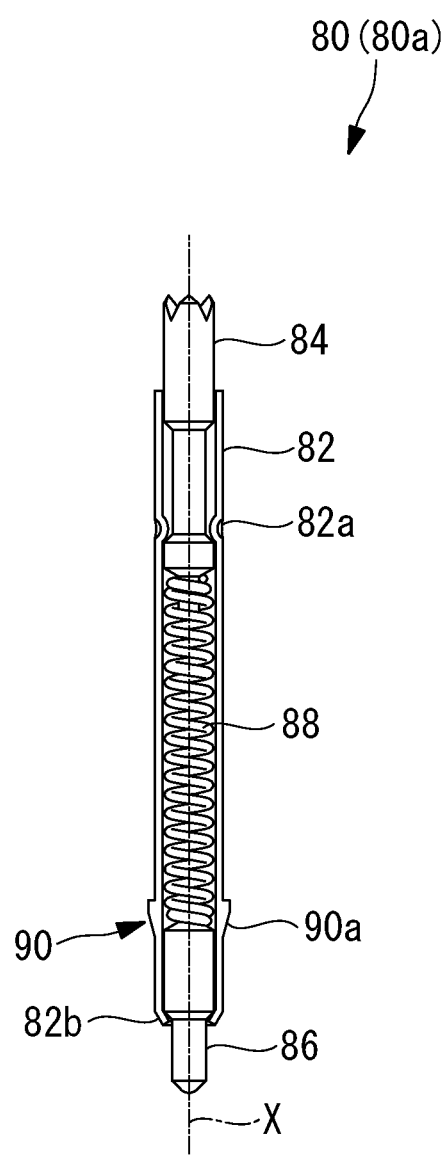
FIG. 6 is a vertical cross-sectional view of a contact terminal corresponding to that in FIG. 5.
Figure 8:
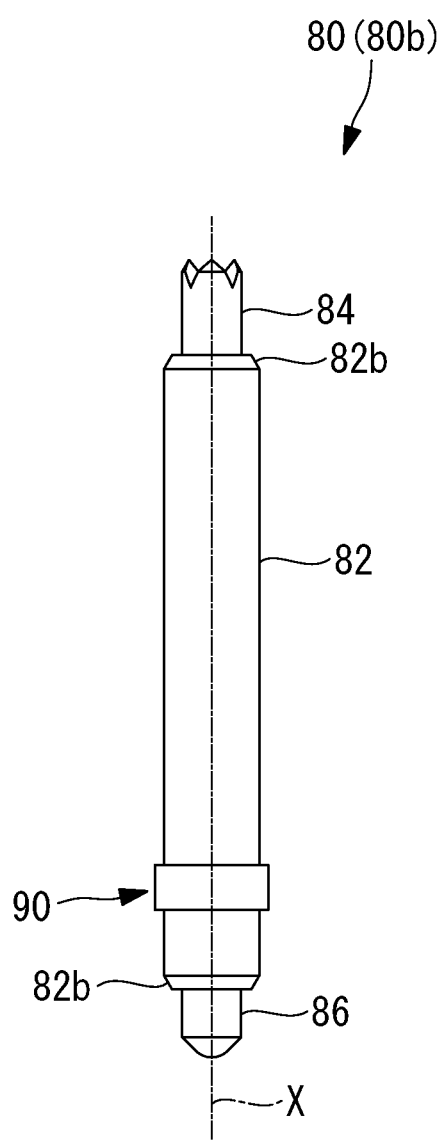
FIG. 8 is a side view of a contact terminal for a grounding line and a power supply line according to the first embodiment.
Figure 9:
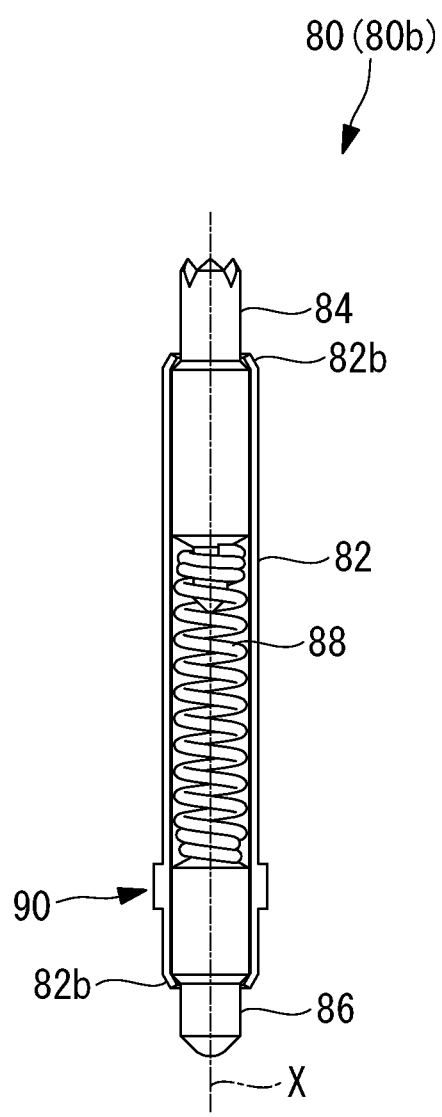
FIG. 9 is a vertical cross-sectional view of a contact terminal corresponding to that in FIG. 8.

As shown in FIGS. 5, 6, 8, and 9, the contact terminal 80 in this embodiment comes in two type: a first contact terminal 80a and a second contact terminal 80b. The first contact terminal 80a shown in FIGS. 5 and 6 is used for a signal line. On the other hand, the second contact terminal 80b shown in FIGS. 8 and 9 is used for a ground line or power supply line.

Hereinafter, when it is not necessary to distinguish between the first contact terminal 80a and the second contact terminal 80b, it is simply referred to as "contact terminal 80".

As shown in FIGS. 5 and 6, the first contact terminal 80a has a tubular barrel 82 extending in the axial direction X, a device-side terminal 84 provided at one end of the barrel 82

(the upper end in the drawing or the end located on the inspection device side), a board-side terminal 86 provided on the other end of the barrel 82 (the lower end in the drawing or the end located on the inspection board side), and a spring 88 contained in the barrel 82.

The device-side terminal 84 is provided so as to slide in the state where the basal end is contained in the barrel 82. A point caulking portion 82*a* is provided at one end of the barrel 82 so that a part of the inner diameter of the barrel 82 is reduced, which prevents the device-side terminal 84 from separating from the barrel 82. The solder ball 96*a* of the IC package comes into contact with the tip of the device-side terminal 84.

The board-side terminal 86 is provided so as to slide in the state where the basal end is contained in the barrel 82. A one-sided caulking portion 82*b* is provided at the other end of the barrel 82 so that a part of the inner diameter of the barrel 82 is reduced, which prevents the board-side terminal 86 from separating from the barrel 82. The inspection board 98 comes into contact with the tip of the board-side terminal 86.

A spring 88 contained in the barrel 82 is in contact with the basal end of the device-side terminal 84 and the basal end of the board-side terminal 86, and urges the device-side terminal 84 and the board-side terminal 86 in a direction to separate them from each other.

A flange section 90 is integrally formed on the barrel 82. The flange section 90 is a section of the barrel 82 extending along the axial direction X and having a diameter increased to have radial expansion. In FIG. 5, the outer diameter (maximum outer diameter) of the flange section 90 is indicated by D1, and the outer diameter (maximum outer diameter) of the barrel 82 in the portion where the flange section 90 is not formed is indicated by D2. At this time, D1/D2 is preferably, for example, about 1.1 to 1.3. As a result, the volume of the flange section 90 can be reduced and the flange section 90 can be reliably brought into contact with the fourth housing 40.

The flange section 90 is preferably provided within a half range from the other end side of the barrel 82 (inspection board 98 side) in the axial direction X, more preferably a quarter range from the other end side of the barrel 82.

Figure 7:
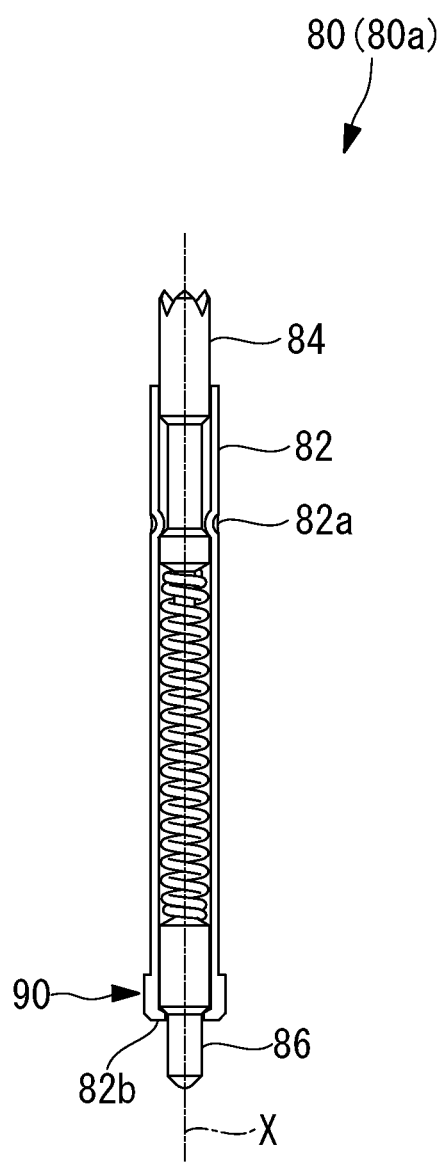
FIG. 7 is another example of a contact terminal for a signal line according to the first embodiment.

As shown in FIG. 7 in addition to the examples shown in FIGS. 5 and 6, the flange section 90 may be formed at the other end (lower end in the drawing) of the barrel 82. Hence, the other end of the barrel 82 and the end of the flange section 90 coincide with each other, which makes it easy to control the dimension of the flange section 90 in the axial direction X. Accordingly, the barrel 82 with the flange section 90 can be easily manufactured.

A tapered portion 90*a* may be formed in the flange section 90. The tapered portion 90*a* is a surface whose diameter decreases from one end side to the other end side of the barrel 82. Although the impedance of the contact terminal 80 may change due to the formation of the flange section 90, the change in impedance can be minimized by using the tapered portion 90*a* to reduce the volume of the flange section 90. This configuration is advantageous for the first contact terminal 80*a* used for a signal line.

FIGS. 8 and 9 show the second contact terminal 80*b*. The configuration of the second contact terminal 80*b* differs from that of the first contact terminal 80*a* in the following points. The second contact terminal 80*b* has a larger diameter than the first contact terminal 80*a*, the device-side terminal 84 is held by the one-sided caulking portion 82*b*, and the flange section 90 does not have the tapered portion 90*a*. These differences will be explained below.

The barrel 82 of the second contact terminal 80*b* has a larger diameter (inner diameter and outer diameter) than the barrel 82 of the first contact terminal 80*a*. Moreover, the diameters of the device-side terminal 84 and the board-side terminal 86 of the second contact terminal 80*b* are set large according to the dimensions of the barrel 82. Hence, the electric resistance of the second contact terminal 80*b* can be made low. This configuration is advantageous for the second contact terminal 80*b* used as a ground line or power supply line.

The device-side terminal 84 is provided so as to slide in the state where the basal end is contained in the barrel 82. A one-sided caulking portion 82*b* is provided at the other end of the barrel 82 so that a part of the inner diameter of the barrel 82 is reduced, which prevents the device-side terminal 84 from separating from the barrel 82.

A flange section 90 is integrally formed on the barrel 82 of the second contact terminal 80*b*. However, unlike the first contact terminal 80*a*, it does not have the tapered portion 90*a*. This is because the second contact terminal 80*b* is used as a ground line or power supply line and does not require consideration of the impedance.

Figure 10:
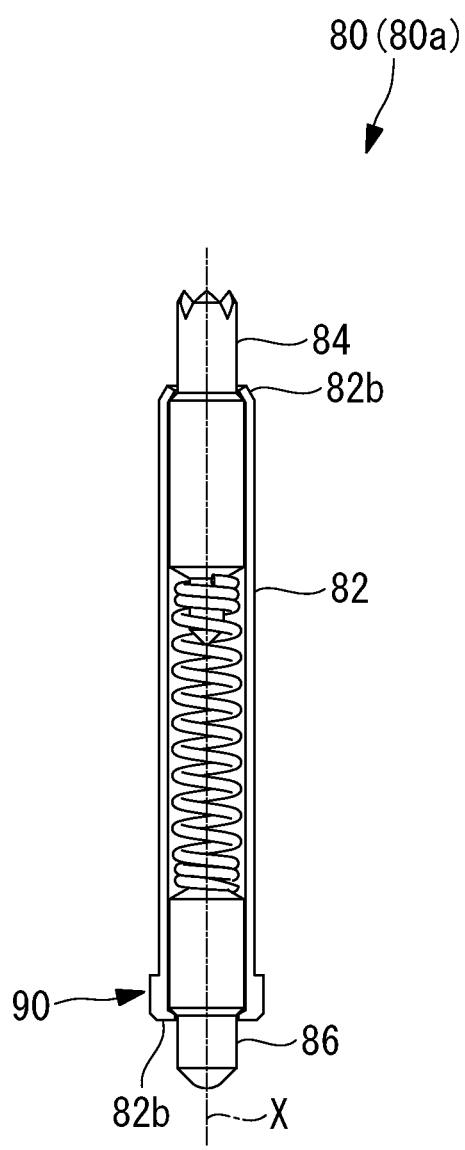
FIG. 10 shows another example of a contact terminal for a grounding line and a power supply line.

Note that the tapered portion 90*a* may also be formed in the flange section 90 of the second contact terminal 80*b*. Further, as shown in FIG. 10, the flange section 90 may be formed at the other end of the barrel 82 (the lower end in the drawing).

The first to fifth housings 10 to 50 constituting the housing 7 will now be described.

Figure 11:
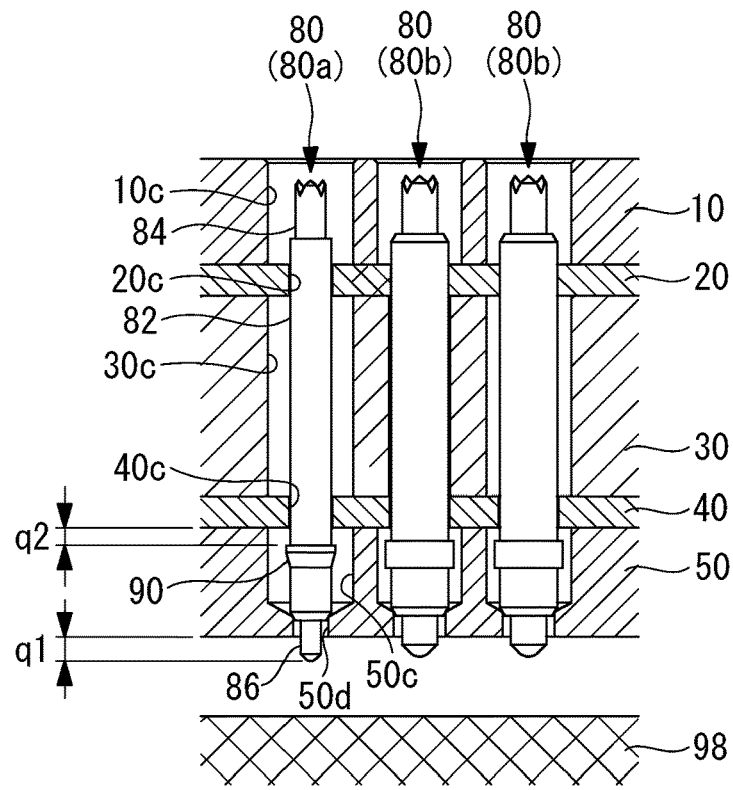
FIG. 11 is a partial vertical cross-sectional view (non-populated state) of the housing according to the first embodiment.

As shown in FIGS. 2, 3 and 11, the first housing 10 is made of a metal such as an aluminum alloy and has conductivity. This contributes to a reduction in crosstalk between adjacent contact terminals 80. An insulating layer is formed on the upper surface of the first housing 10 and on the region in contact with the IC package, and on the inner surface of the through holes 10*c* in contact with the solder balls 96*a* of the IC package. This prevents short-circuiting between the IC package and the first housing 10. The insulating layer may be, for example, alumite (anodized film) or an insulating film formed by painting.

The first housing 10 is a plate-like body having an outer shape having a generally square or a generally rectangular shape with chamfered corners. The first housing 10 is required to be thick enough to accommodate at least the solder balls 96*a* of the IC package. For instance, in FIG. 11, the height of the solder balls 96*a* of the IC package is about 0.35 mm, whereas the thickness of the first housing 10 is 0.5 mm or more and 1.5 mm or less, specifically about 0.8 mm. A fixing hole 10*a* through which a housing fixing thread 9 is inserted is formed at each of the four corners of the first housing 10. A positioning pin hole 10*b* through which a positioning pin 30*b* provided in the third housing 30 is inserted is formed near each of a pair of opposite corners of the first housing 10. A plurality of through holes 10*c* through which the respective contact terminals 80 are inserted are formed in the central portion of the first housing 10. The plurality of through holes 10*c* are located in positions overlapping the positions of the solder balls 96*a* of the IC package.

As shown in FIG. 11, each through hole 10*c* has a tubular shape having an inner diameter that is fixed in the plate thickness direction of the first housing 10. The inner diameter of each through hole 10*c* is larger than the outer diameter of the contact terminal 80 (that is, the outer diameter D2 of the flange, which is the maximum outer diameter of the entire barrel 82). The inner diameter of each through hole 11*c* is larger than the diameter of the solder balls 96*a* of the IC package.

As shown in FIGS. 2, 3 and 11, the second housing 20 is a rigid board that is a rigid resin board. To be specific, the second housing 20 is a printed circuit board (PCB). The printed circuit board is a glass epoxy board in which a glass woven cloth of glass fibers woven into cloth is impregnated with epoxy resin, a polyimide (PI) board, or the like, preferably one having higher strength than a polyetherimide (PEI) board.

Metal layers as conductive layers are formed on the upper surface and the lower surface of the second housing 20. Plated through vias are provided to establish electrical continuity between the plating layers formed on the upper and lower surfaces. Hence, the second housing 20 is electrically connected to the upper first housing 10 and also electrically connected to the lower third housing 30, and the first housing 10 and the third housing 30 are electrically connected.

The second housing 20 is a plate-like body having an outer shape having a generally square or a generally rectangular shape with chamfered corners. The outer shape of the second housing 20 in a plan view substantially matches the outer shape of the first housing 10. The thickness of the second housing 20 is, for example, 0.1 mm or more and 1.0 mm or less, and is specifically 0.2 mm. A fixing hole 20*a* through which a housing fixing thread 9 is inserted is formed at each of the four corners of the second housing 20. A positioning pin hole 20*b* through which a positioning pin 30*b* provided in the third housing 30 is inserted is formed near each of a pair of opposite corners of the second housing 20. A plurality of through holes (positioning holes) 20*c* through which the respective contact terminals 80 are inserted are formed in the central portion of the second housing 20. The arrangement of the plurality of through holes 20*c* corresponds to the arrangement of the through holes 10*c*.

As shown in FIG. 11, each through hole 20*c* has a tubular shape having an inner diameter that is fixed in the plate thickness direction of the second housing 20. The inner diameter of each through hole 20*c* is slightly larger than the outer diameter D2 of the barrel 82 (excluding the flange section 90) of the contact terminal 80, and smaller than the outer diameter D1 of the flange section 90. Each through hole 20*c* is a positioning hole for positioning the contact terminal 80 (barrel 82). Therefore, the diameter of each through hole 20*c* is set so that a predetermined gap from the barrel 82 is secured to such an extent that the contact terminal 80 is not inclined. The gap is, for example, 10 μm or more and 50 μm or less.

Of the contact terminals 80, the through hole 20*c* through which the first contact terminal 80*a* for a signal line is inserted, and the through hole 20*c* through which the second contact terminal 80*b* as a power supply line is inserted are non-plated holes which are not plated. In other words, electrical insulation is provided between the first contact terminal 80*a* and the second housing 20.

On the other hand, the through hole 20*c* through which the second contact terminal 80*b* as a grounding line is inserted is a plated hole which is provided with a plating layer. The through hole 20*c* through which the second contact terminal 80*b* as a grounding line is inserted is therefore also used as a through via.

As shown in FIGS. 2, 3 and 11, like the first housing 10, the third housing 30 is made of a metal such as an aluminum alloy and has conductivity. However, unlike the first housing 10, the third housing 30 does not have an insulating layer on either the upper surface or the lower surface. Consequently, it is electrically connected to the upper second housing 20 and the lower fourth housing 40. A plating layer is formed on the surface of the third housing 30. This improves the connection between the second housing 20 and the fourth housing 40 and makes it less likely to be affected by corrosion or the like even after long-term use. To be specific, Ni—Au plating with good conductivity and corrosion resistance is preferable. Similarly to the first housing 10, the third housing 30 has a generally square or generally rectangular shape in a plan view, and has fixing holes 30*a* and through holes 30*c*. The arrangement of the plurality of through holes 30*c* corresponds to the arrangement of the through holes 10*c*. Positioning pins 30*b* protruding upward are provided on the upper surface of the third housing 30 in positions overlapping the positioning pin holes 10*b* formed in the first housing 10 and the like. Positioning pins 30*b* protruding downward are also provided on the lower surface of the third housing 30 in positions overlapping the positioning pin holes 40*b* formed in the fourth housing 40 and the like.

As shown in FIG. 11, each through hole 30*c* has a tubular shape having an inner diameter that is fixed in the plate thickness direction of the third housing 30. The inner diameter of each through hole 30*c* is larger than the outer diameter of the contact terminal 80 (that is, the outer diameter D2 of the flange, which is the maximum outer diameter of the entire barrel 82).

The third housing 30 has a larger thickness than the first housing 10 and the fifth housing 50. The thickness of the third housing 30 is, for example, 1.0 mm or more and 3.0 mm or less, and is specifically 1.5 mm.

As shown in FIGS. 2, 3, and 11, the fourth housing 40 is a rigid board that is a rigid resin board, similarly to the second housing 20. Similarly to the second housing 20, the fourth housing 40 has plating layers on the upper and lower surfaces, and has through vias for establishing electrical continuity between the plating layers on the upper and lower surfaces. Hence, the fourth housing 40 is electrically connected to the upper third housing 30 and also electrically connected to the lower fifth housing 50, and the third housing 30 and the fifth housing 50 are electrically connected.

The fourth housing 40 is a plate-like body having an outer shape having a generally square or a generally rectangular shape with chamfered corners. The outer shape of the fourth housing 40 in a plan view substantially matches the outer shape of the first housing 10. The thickness of the fourth housing 40 is, for example, 0.1 mm or more and 1.0 mm or less, and is specifically 0.2 mm. A fixing hole 40*a* through which a housing fixing thread 9 is inserted is formed at each of the four corners of the fourth housing 40. A positioning pin hole 40*b* through which a positioning pin 30*b* provided in the third housing 30 is inserted is formed near each of a pair of opposite corners of the fourth housing 40. A plurality of through holes (positioning holes) 40*c* through which the respective contact terminals 80 are inserted are formed in the central portion of the fourth housing 40. The arrangement of the plurality of through holes 40*c* corresponds to the arrangement of the through holes 10*c*.

As shown in FIG. 11, each through hole 40*c* has a tubular shape having an inner diameter that is fixed in the plate thickness direction of the fourth housing 40. The inner diameter of each through hole 40*c* is slightly larger than the outer diameter D2 of the barrel 82 (excluding the flange section 90) of the contact terminal 80, and smaller than the outer diameter D1 of the flange section 90. Each through hole 40c is a positioning hole for positioning the contact terminal 80 (barrel 82). Therefore, the diameter of each through hole 40c is set so that a predetermined gap from the barrel 82 is secured to such an extent that the contact terminal 80 is not inclined. The gap is, for example, 10 μm or more and 50 μm or less.

Of the contact terminals 80, the through hole 40c through which the first contact terminal 80a for a signal line is inserted, and the through hole 40c through which the second contact terminal 80b as a power supply line is inserted are non-plated holes which are not plated. In other words, electrical insulation is provided between the first contact terminal 80a and the fourth housing 40.

On the other hand, the through hole 40c through which the second contact terminal 80b as a grounding line is inserted is a plated hole which is provided with a plating layer. The through hole 40c through which the second contact terminal 80b as a grounding line is inserted is therefore also used as a through via.

As shown in FIGS. 2, 3 and 11, like the first housing 10, the fifth housing 50 is made of a metal such as an aluminum alloy and has conductivity. To be electrically connected to the fourth housing 40, the fifth housing 50 does not have an insulating layer on the upper surface. However, an insulating layer is provided on the bottom surface in order to prevent short circuiting between the electrodes (pads) disposed on the inspection board and the wiring. Moreover, an insulating layer is also provided on the inner surface of the through holes 50c and the small-diameter portion 50d to come into contact with the contact terminal 80. Similarly to the first housing 10, the fifth housing 50 has a generally square or generally rectangular shape in a plan view, and has fixing holes 50a and through holes 50c. The arrangement of the plurality of through holes 50c corresponds to the arrangement of the through holes 10c. A positioning pin hole 50b through which a positioning pin 30b provided in the third housing 30 is inserted is formed near each of a pair of opposite corners of the fifth housing 50.

As shown in FIG. 11, each through hole 50c has a tubular shape having an inner diameter that is fixed in the plate thickness direction of the fifth housing 50. The inner diameter of each through hole 50c is larger than the outer diameter of the contact terminal 80 (that is, the outer diameter D2 of the flange, which is the maximum outer diameter of the entire barrel 82). The flange section 90 of the contact terminal 80 is contained in the through hole 50c. A small-diameter portion 50d whose diameter decreases toward the inspection board 98 side (the lower side in the drawing) is formed in each through hole 11c. The inner diameter of the small-diameter portion 50d is smaller than the outer diameter of the other end of the barrel 82 and larger than the outer diameter of the tip of the board-side terminal 86. Hence, the other end (the lower end in the drawing) of the barrel 82 can be brought into contact with the small-diameter portion 50d while the tip of the board-side terminal 86 is projected from the through holes 50c. The small-diameter portion 50d has a tapered shape in the drawing, but may have a stepped shape.

Figure 12:
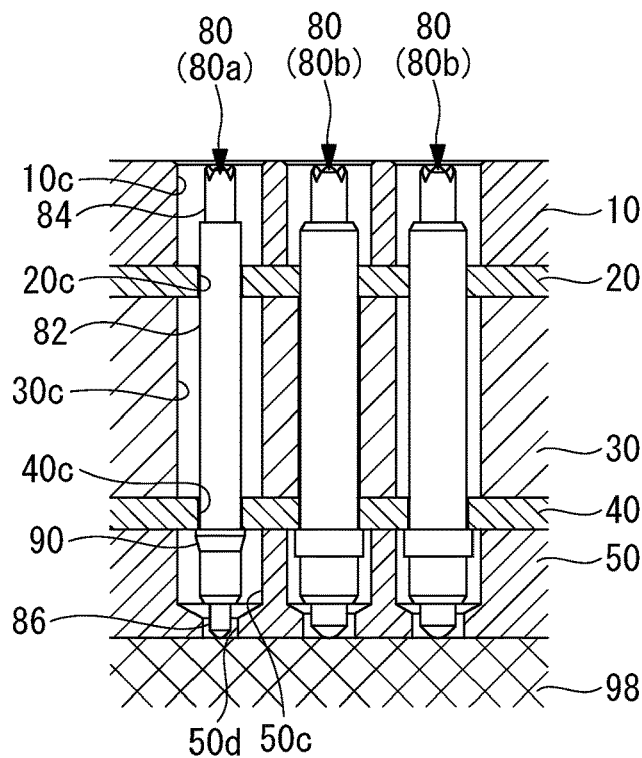
FIG. 12 is a partial vertical cross-sectional view (populated state) of the housing according to the first embodiment.

When the socket 1 is not populated on the inspection board 98, the protruding length of the board-side terminal 86 protruding from the lower surface of the fifth housing 50 is q1. The length from the lower surface of the fourth housing 40 to the upper surface of the flange section 90 is q2. Here, q1 is set larger than q2. As a result, as shown in FIG. 12, when the socket 1 is populated on the inspection board 98, the upper surface of the flange section 90 formed on the barrel 82 of the contact terminal 80 pushed up by the inspection board 98 comes into contact with the lower surface of the fourth housing 40, and the board-side terminal 86 is further pushed into the barrel 82. Accordingly, an initial load (preload) can be applied to the contact terminal 80.

The through holes 10c of the first housing 10, the through holes 30c of the third housing 30, and the through holes 50c of the fifth housing are all larger than the outer diameter of the contact terminals 80 (that is, the outer diameter D2 of the flange which is the maximum outer diameter of the entire barrel 82).

In particular, a predetermined gap is provided for the outer diameter of the first contact terminals 80a used for signal lines. The gaps are not merely an insertion margin for allowing the first contact terminals 80a to be inserted, but gaps (dielectric layers) for impedance matching. Each gap can be changed as appropriate according to the specifications of the socket 1, and is adjusted so that a desired impedance (for example, about 40Ω to 50Ω) can be obtained. In other words, the socket 1 according to this embodiment adopts a so-called coaxial structure. The dielectric layers may be mere gaps (air) or composed of a substance such as a resin or ceramic.

Figure 13:
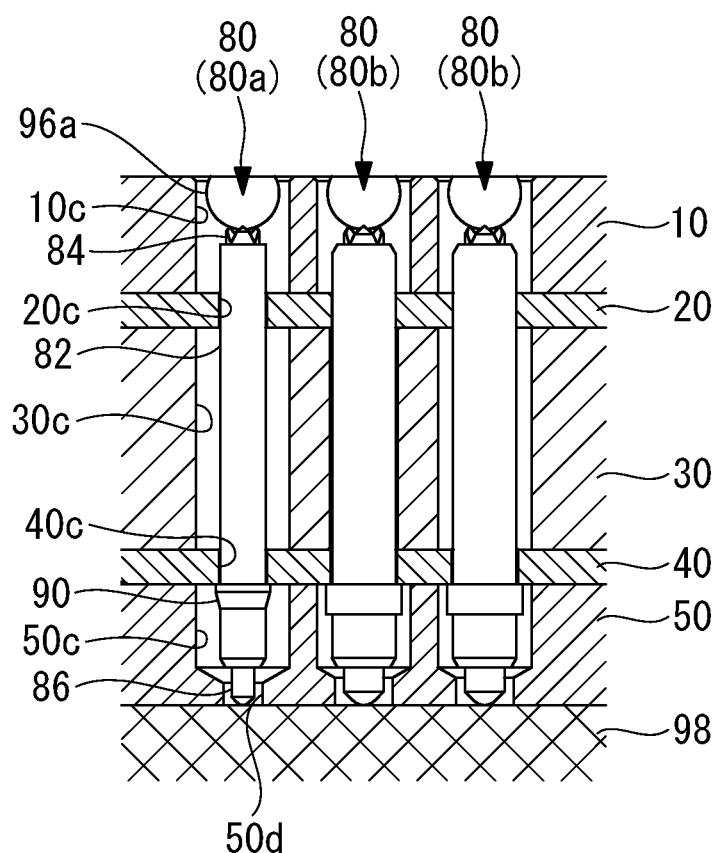
FIG. 13 is a partial vertical cross-sectional view (IC package-populated state) of the housing according to the first embodiment.

As shown in FIG. 13, the IC package is placed on the socket 1 populated on the inspection board 98, from the upper surface of the first housing 10. The solder balls 96a of the IC package are contained in the through holes 10c of the first housing 10, come into contact with the tips of the device-side terminals 84 of the contact terminals 80, and push the device-side terminals 84 into the barrels 82. As a result, electrical continuity is established between the IC package and the inspection board 98 via the socket 1.

A method of assembling the socket 1 will now be described.

Figure 14:
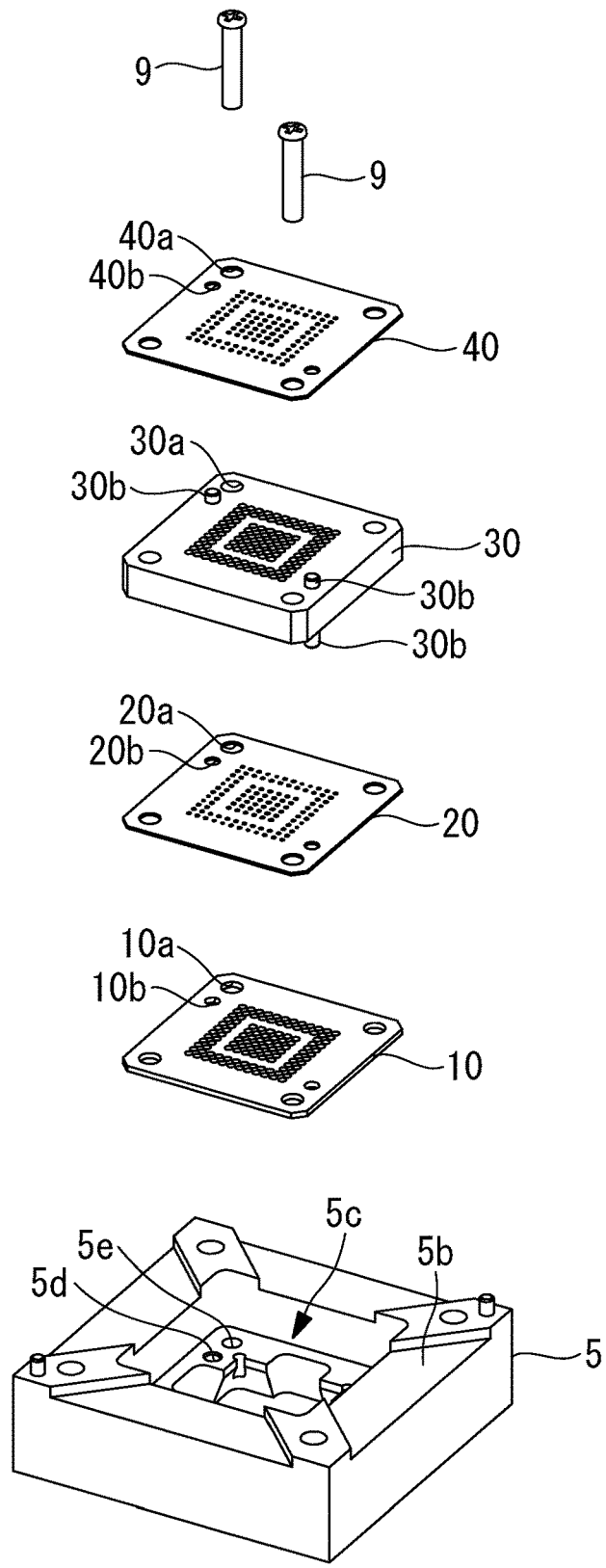
FIG. 14 is a perspective view showing a process for assembling an inspection socket.

First, as shown in FIG. 14, the socket base 5 is turned upside down so that the bottom surface 5b faces upward.

Positioning pin holes 5d are formed in the container recess 5c formed in the socket base 5. The positioning pins 30b provided on a surface (the lower surface during assembly) of the third housing 30 are inserted into the positioning pin holes 5d. Further, taps 5e are formed at the four corners in the container recess 5c. Housing fixing threads 9 are inserted through the taps 5e.

Figure 15:
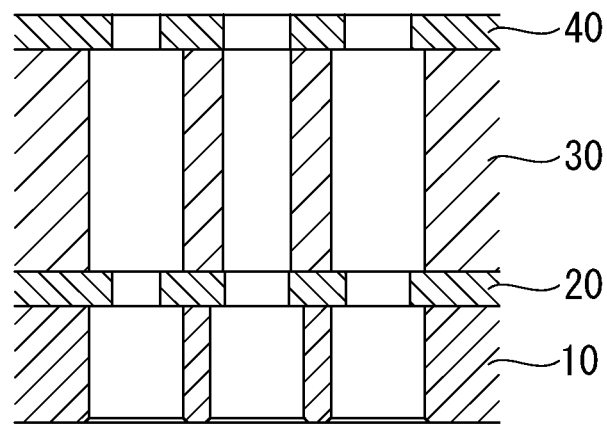
FIG. 15 is a partial vertical cross-sectional view showing a process for assembling an inspection socket.

The first housing 10, the second housing 20, the third housing 30, and the fourth housing 40 are inserted in this order into the container recess 5c formed in the socket base 5 and laminated (see FIG. 15). At this time, the positioning pins 30b provided on the surface of the third housing 30 pass through the positioning pin holes 20b in the second housing 20 and the positioning pin holes 10b in the first housing 10, and are inserted through the positioning pin holes 5d of the socket base 5.

Similarly, the positioning pins 30b provided on the bottom surface (the upper surface during assembly) of the third housing 30 are inserted into the positioning pin holes 40b of the fourth housing 40, so that the first to fourth housings 10 to 40 are positioned relatively to the socket base 5.

The housing fixing threads 9 are then passed through the two fixing holes 10a, 20a, 30a, and 40a located at the opposite corners of the first to fourth housings 10 to 40 and screwed to the taps 5e of the socket base 5, whereby the first to fourth housings 10 to 40 are integrally fixed to the socket base 5.

Figure 16:
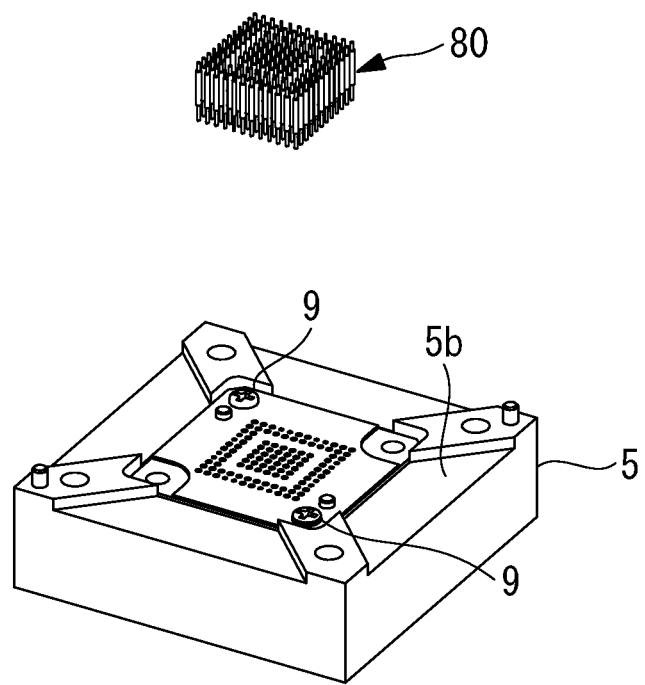
FIG. 16 is a perspective view showing a process for assembling an inspection socket.
Figure 17:
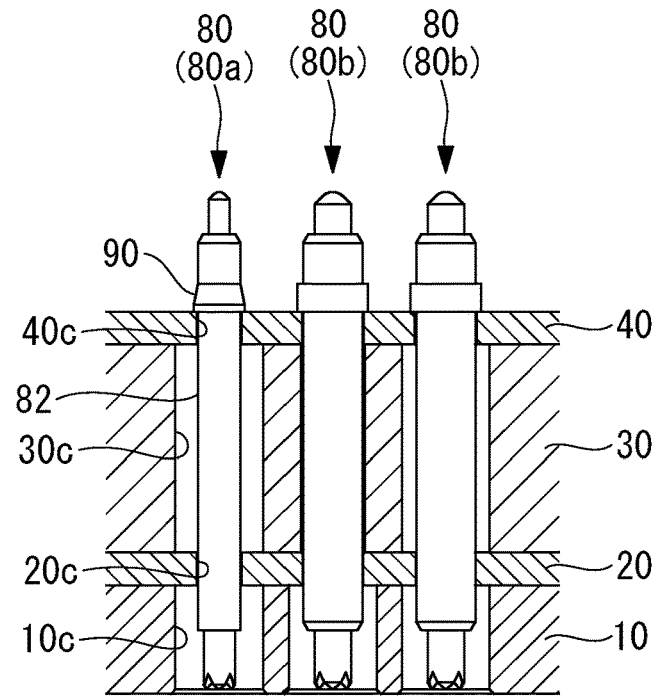
FIG. 17 is a partial vertical cross-sectional view showing a process for assembling an inspection socket.

Subsequently, as shown in FIG. 16, the contact terminals 80 are inserted into the through holes 10c, 20c, 30c, and 40c in the axial direction X (FIG. 17). Each inserted contact terminal 80 is positioned and aligned at two points: the through hole 20c of the second housing 20 and the through hole 40c of the fourth housing 40. Further, the flange section 90 is hung on the fourth housing 40, and the contact terminal 80 is hung from the fourth housing 40. At this time, the flange section 90 is provided within a half range (preferably a quarter range) from the other end of the barrel 82. Hence, each contact terminal 80 has the center of gravity vertically below the flange section 90 when assembled upside down. As a result, the contact terminals 80 stably hang from the fourth housing 40. In particular, the contact terminals 80 hang from the fourth housing 40 so that the axis X of each contact terminal 80 is parallel with the vertical direction. This makes it possible to prevent the inclination of each contact terminal 80.

Note that a mask that has an array of holes defined according to each outer diameter of the contact terminal 80 may be prepared and inserted into the through holes 10c, 20c, 30c, and 40c. The mask is removed when all the contact terminals 80 have been inserted.

Figure 18:
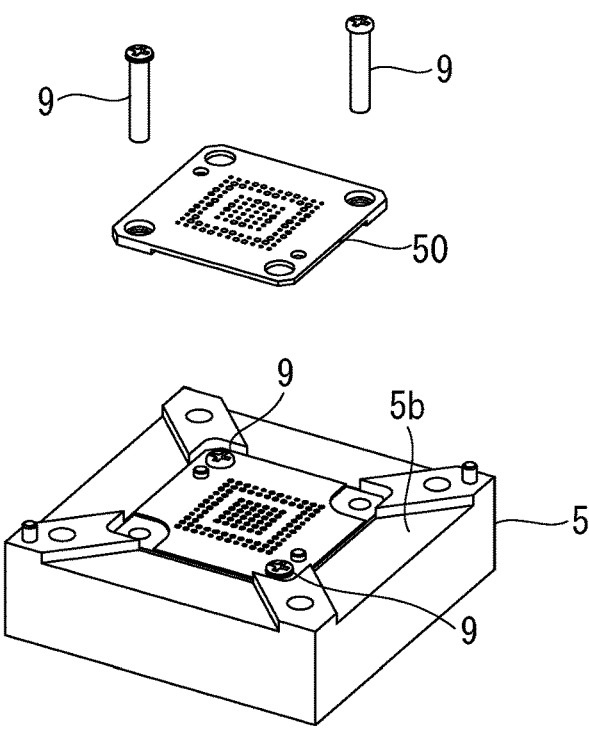
FIG. 18 is a perspective view showing a process for assembling an inspection socket.
Figure 19:
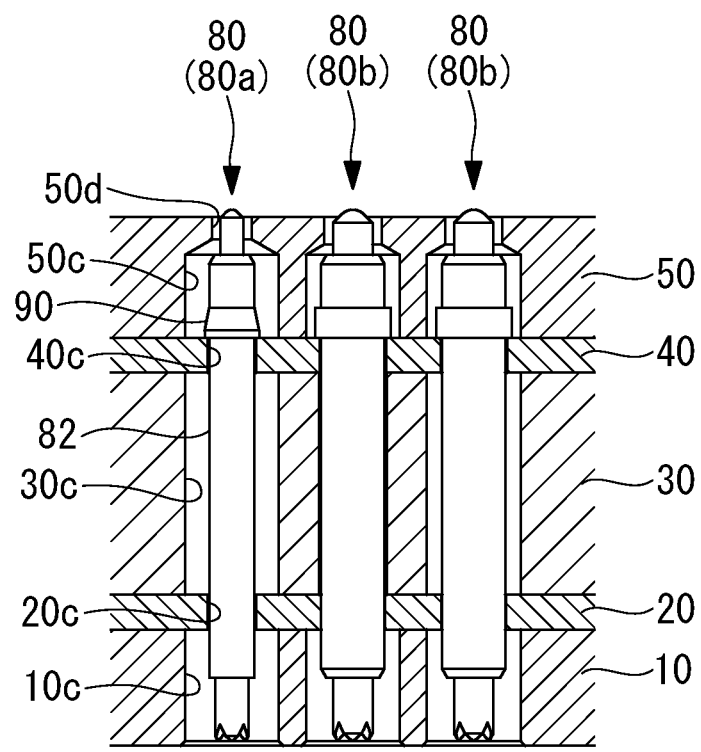
FIG. 19 is a partial vertical cross-sectional view showing a process for assembling an inspection socket.

Next, as shown in FIG. 18, the fifth housing 50 is laminated on the fourth housing 40 (see FIG. 19). Hence, the flange sections 90 of the contact terminals 80 are contained in the through holes 50c of the fifth housing 50. At this time, the positioning pins 30b provided in the third housing 30 are inserted into the positioning pin holes 50b so that the fifth housing 50 is relatively positioned. The housing fixing threads 9 are then inserted into the remaining two fixing holes 10a, 20a, 30a, 40a, and 50a in the first to fifth housings 10 to 50 and screwed to the socket base 5, whereby the first to fifth housings 10 to 50 are integrally fixed to the socket base 5. Thus, the assembly of the socket 1 is completed.

According to this embodiment, when the socket 1 is populated on the inspection board 98, the contact terminals 80 are pushed by the fourth housing 40 via the flange sections 90, so that the contact terminals 80 are preloaded. At this time, the reaction force of the preload acts on the fourth housing 40 that is on the flange sections 90. However, since the fourth housing 40 can be pressed by the first to third housings 10 to 30 laminated on the fourth housing 40, warpage in the fourth housing 40 on the flange section 90 can be suppressed.

In addition, preloading the contact terminals 80 (flange sections 90) with the fourth housing 40 eliminates the need for preloading the shoulder portion of the barrel 82 from the IC package side. Therefore, a housing (alignment board) for pushing the barrel 82 from the IC package side is unnecessary, and the device-side terminal 84 can be shortened accordingly. Consequently, the attenuation of the transmission signal can be suppressed. Moreover, since the heat value is reduced, the allowable current can be improved. Further, the deflection due to the inclination of the device-side terminal 84 is reduced, so that the concentric accuracy can be improved.

Also, for assembling the socket 1 upside down, the contact terminals 80 can be hung from the fourth housing 40 through the flange sections 90, being aligned using two through holes 40c and 20c. This stabilizes the positions of the contact terminals 80, thereby facilitating the assembly of the socket 1 and maintenance (for example, replacement of the contact terminals 80).

Figure 20:
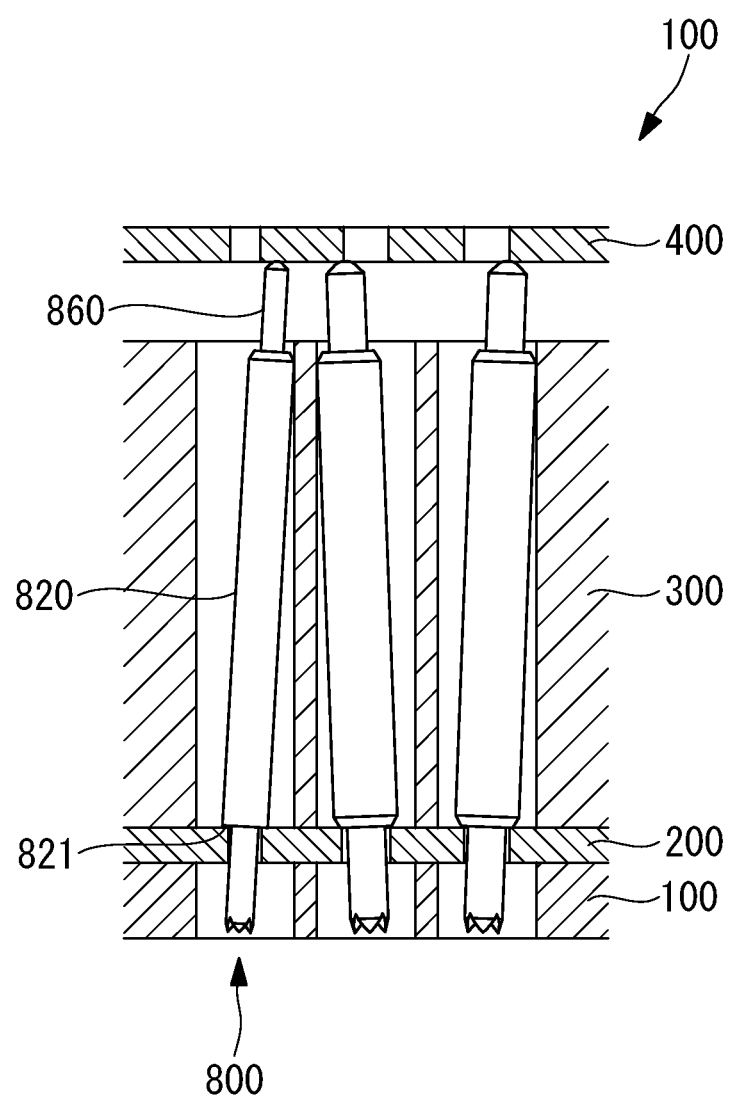
FIG. 20 is a partial vertical cross-sectional view during assembly of an inspection socket as a comparative example.

Note that the socket 100 shown in FIG. 20 is taken as a comparative example. The contact terminals 800 contained in the socket 100 are of a type preloaded at the shoulder portion 821 of the barrel 820. Therefore, the shoulder portion 821 of the barrel 820 comes into contact with the second housing 200 at the time of assembling upside down. At this time, the center of gravity of each contact terminal 800 is located above the contact portion between the second housing 200 and the barrel 820. Since the contact terminals 800 are only aligned through the second housing 200, they are positioned at one point. Hence, the contact terminals 800 may be inclined in the through holes of the third housing 300. If a contact terminal 800 is inclined, the fourth housing 400 may come into contact with the board-side terminal 860 of the contact terminal 800 and be damaged when the fourth housing 400 is laminated.

With a conductive metal housing, crosstalk between a contact terminal 80 and another contact terminal 80 can be reduced. For this reason, even if the impedance of the contact terminal 80 is slightly lowered due to the formation of the flange section 90, its influence on the socket 1 as a whole can be suppressed.

Each flange section 90 has a tapered portion 90a. This makes it possible to minimize the impedance mismatch that may occur in the contact terminal 80 due to the formation of the flange section 90. This is particularly useful for the first contact terminal 80a for a signal line where the influence of impedance mismatch should be eliminated.

Second Embodiment

The inspection socket according to the second embodiment of the present invention will now be described with reference to the drawings.

Note that this embodiment differs from the first embodiment in the shape of the flange sections. Therefore, the same components as those in the first embodiment are denoted by the same reference numerals in the following description, and components different therefrom will be described.

Figure 21:
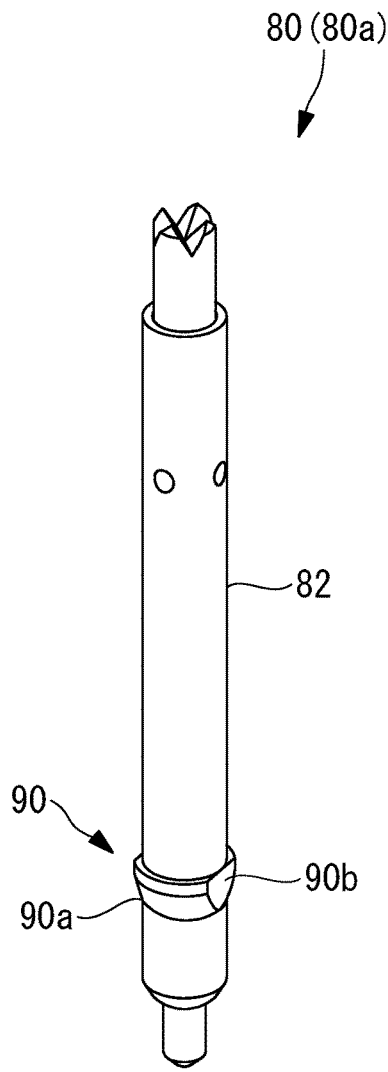
FIG. 21 is a perspective view of a contact terminal for a signal line according to a second embodiment.
Figure 22:
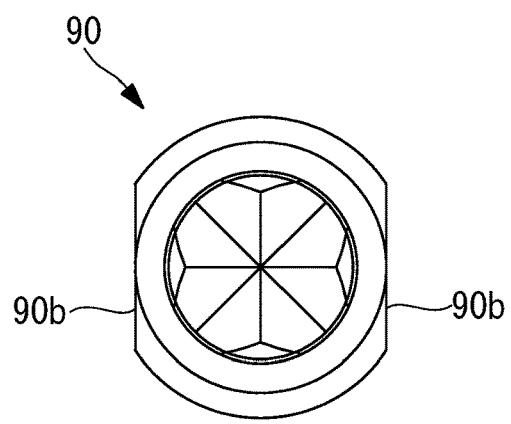
FIG. 22 is a plan view of a flange section according to the second embodiment.
Figure 23:
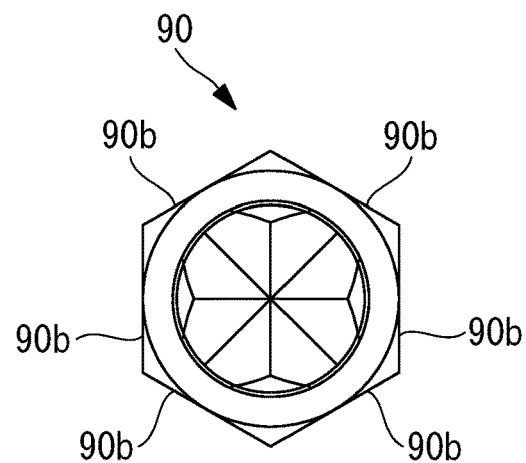
FIG. 23 is a plan view of another example of a flange section according to the second embodiment.

As shown in FIGS. 21 and 22, a cut surface 90b is formed on the flange section 90 of the first contact terminal 80a. The cut surface 90b is formed by cutting off a part of the expanded flange section 90 so that the outer diameter of a part of the flange section 90 is approximately equal to the outer diameter D2 of the barrel 82 (see FIG. 5). The cut surface 90b, which has two faces in the drawing, may have one face or three or more faces, which are, however, preferably provided symmetrically to the axis X so as to come into contact with the fourth housing 40 with an even force. When the cut surface 90b has many faces, the area of the contact portion is small and the surface pressure is high. For this reason, the cut surface 90b preferably has two to six faces (see FIG. 23).

According to this embodiment, the change in impedance can be minimized by reducing the volume of the flange section 90 through the cut surface 90b. This configuration is advantageous for the first contact terminal 80a used for a signal line.

Third Embodiment

An inspection socket according to the third embodiment of the present invention will now be described with reference to the accompanying drawings.

Note that this embodiment differs from the first embodiment in the shape of the flange sections and the shape of the through holes in the fifth housing. Therefore, the same components as those in the first embodiment are denoted by the same reference numerals in the following description, and components different therefrom will be described.

Figure 24:
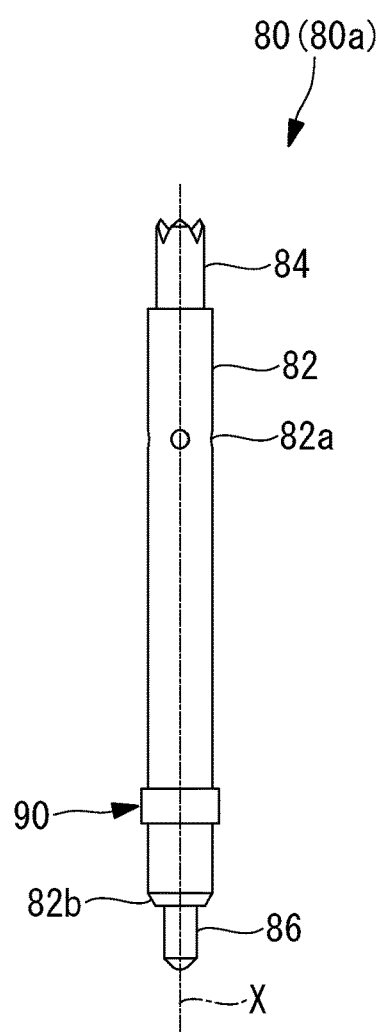
FIG. 24 is a side view of a contact terminal for a signal line according to a third embodiment.

As shown in FIG. 24, no tapered portion 90a is formed on the flange section 90 of the first contact terminal 80a.

Figure 25:
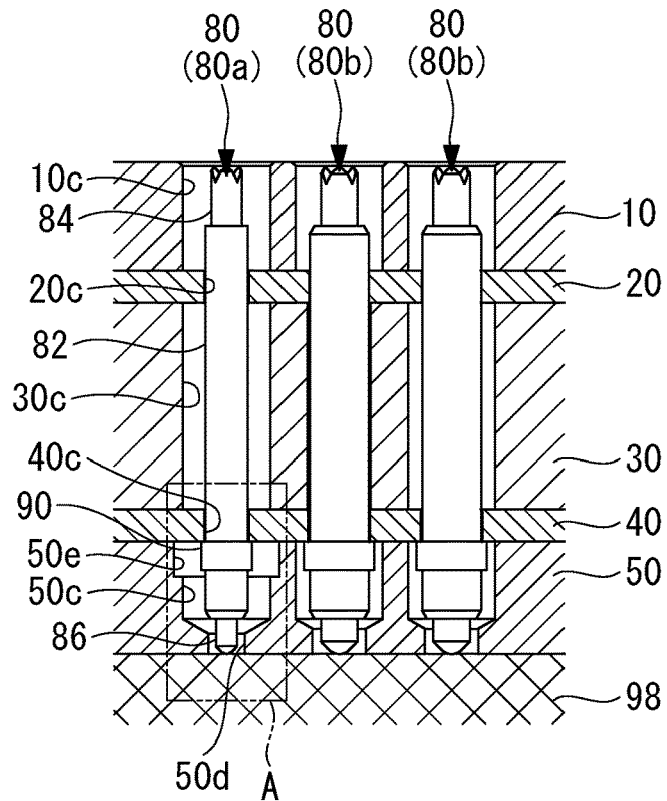
FIG. 25 is a partial vertical cross-sectional view (populated state) of the housing according to the third embodiment.
Figure 26:
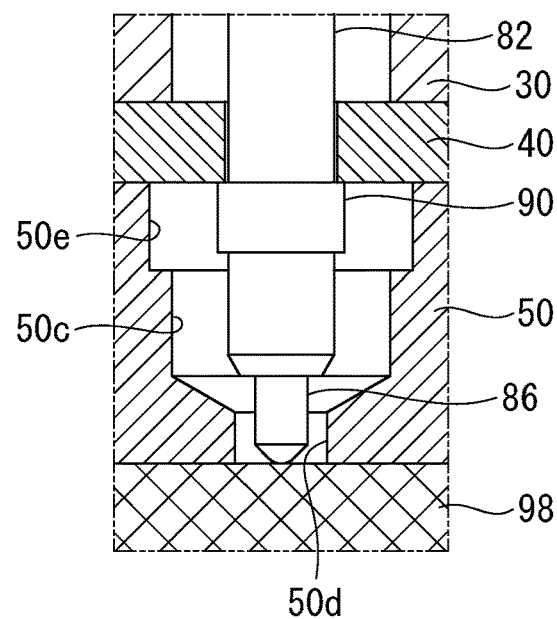
FIG. 26 is a partially enlarged view of the part A shown in FIG. 25.

As shown in FIGS. 25 and 26, the through hole 50c in the fifth housing 50 has a large-diameter portion 50e in a position overlapping the position of the flange section 90 of the first contact terminal 80*a*.

According to this embodiment, the impedance can be matched using the large-diameter portion 50*e*, whereby the impedance mismatch that may occur due to the formation of the flange section 90 can be minimized. This configuration is advantageous for the first contact terminal 80*a* used for a signal line.

Figure 27:
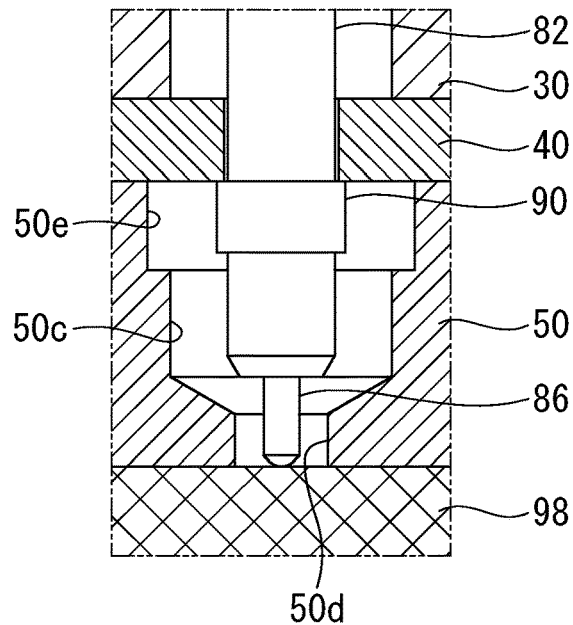
FIG. 27 is a diagram showing a modification of the contact terminal according to the third embodiment.

As shown in FIG. 27, the impedance may be matched by reducing the outer diameter of the tip side of the board-side terminal 86. This configuration is not only for this embodiment and can be adopted in each embodiment.

Fourth Embodiment

An inspection socket according to the fourth embodiment of the present invention will now be described with reference to the accompanying drawings.

Note that this embodiment differs from the first embodiment in the configuration of the contact terminals and the configuration of the fifth housing. Therefore, the same components as those in the first embodiment are denoted by the same reference numerals in the following description, and components different therefrom will be described.

Figure 28:
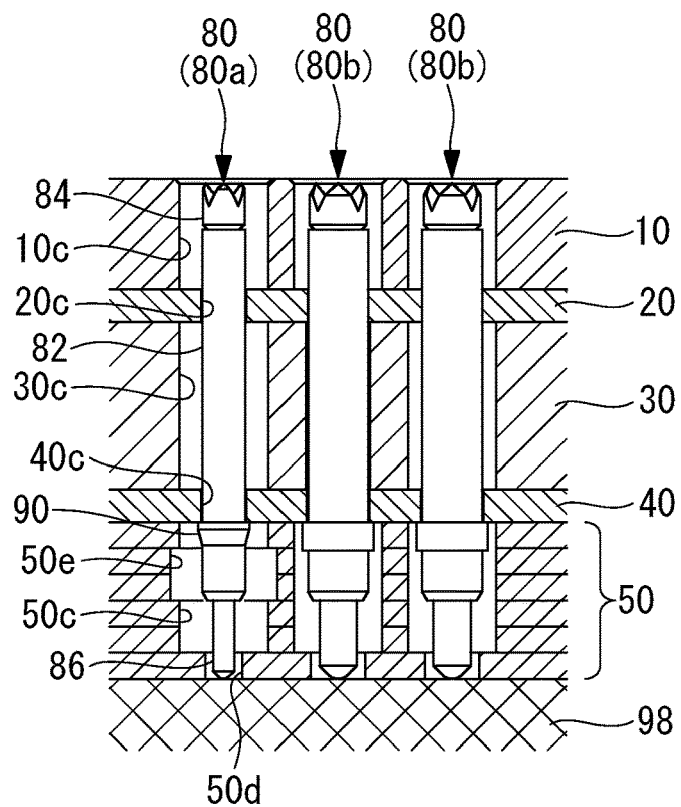
FIG. 28 is a partial vertical cross-sectional view (populated state) of the housing according to the fifth embodiment.

As shown in FIG. 28, the device-side terminal 84 of the contact terminal 80 is fixed with its base end side contained in the barrel 82. In other words, the contact terminal 80 is a so-called one-sided sliding type.

Figure 29:
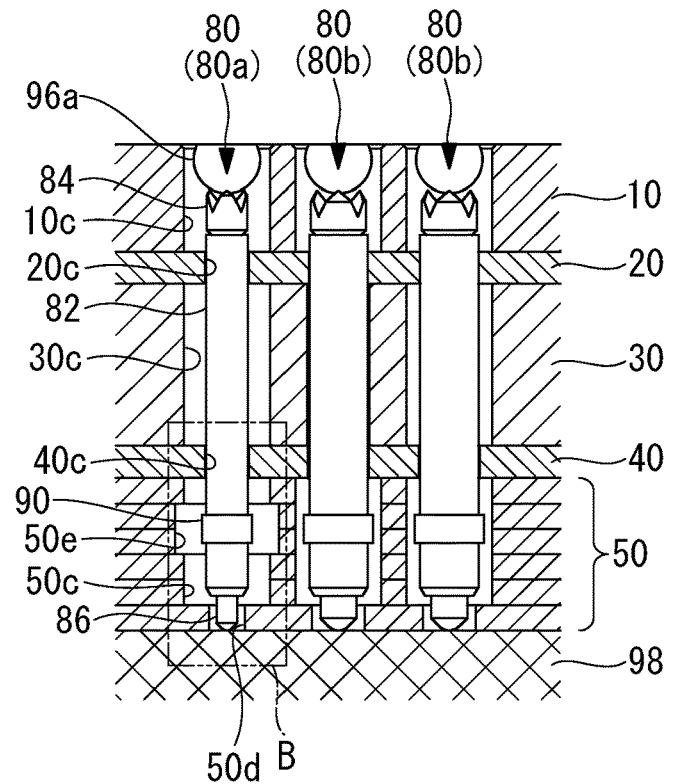
FIG. 29 is a partial vertical cross-sectional view (IC package-populated state) of the housing according to the fifth embodiment.

As shown in FIG. 29, each device-side terminal 84 does not slide with respect to the barrel 82, so that when the IC package is placed on the first housing 10, the device-side terminal 84 in contact with the solder ball 96*a* is pushed down together with the barrel 82. Accordingly, the flange section 90 formed on the barrel 82 also moves downward. Consequently, as shown in FIGS. 29 and 30, the flange section 90 is located in the middle layer of the fifth housing 50.

In the case where the fifth housing 50 is integrally formed, it is troublesome in processing to provide the large-diameter portion 50*e* of the through hole 50*c* only in the middle layer of the fifth housing 50. Here, in this embodiment, the fifth housing 50 consisting of 5-1st to 5-6th housings (split housings) 56*a* to 56*f* is prepared.

Figure 30:
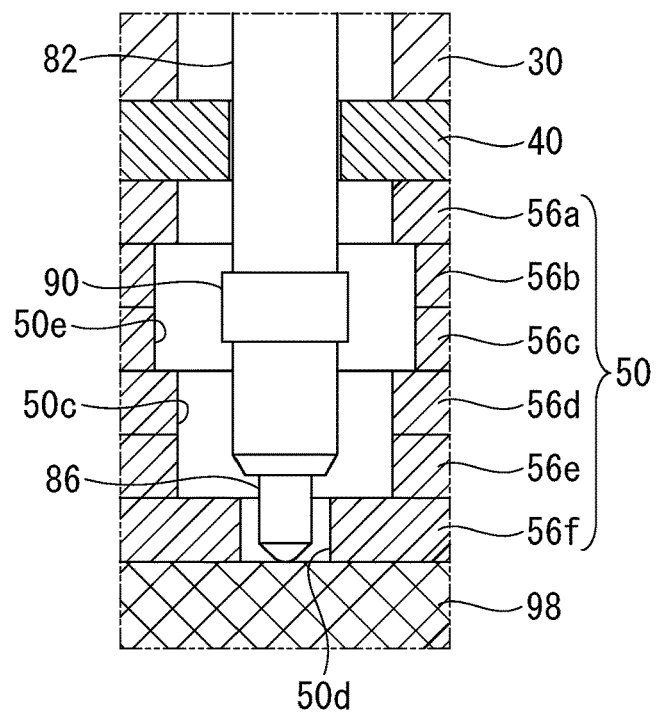
FIG. 30 is a partially enlarged view of the part B shown in FIG. 29.

As shown in FIG. 30, the fifth housing 50 has a laminate of, from top to bottom, the 5-1st housing 56*a*, 5-2nd housing 56*b*, 5-3rd housing 56*c*, 5-4th housing 56*d*, 5-5th housing 56*e*, and 5-6th housing 56*f* in this order.

Before the 5-1st to 5-6th housings 56*a* to 56*f* are laminated, the large-diameter portion 50*e* is preliminarily formed only on the 5-2nd housing 56*b* and 5-3rd housing 56*c* overlapping the middle layer where the flange section 90 is located. After that, the 5-1st to 5-6th housings 56*a* to 56*f* are laminated, so that the large-diameter portion 50*e* can be easily provided in the middle layer of the fifth housing 50. In other words, the large-diameter portion 50*e* adjusted to the position of the flange section 90 can be easily processed.

The 5-1st to 5-6th housings 56*a* to 56*f* are bonded to each other by diffusion bonding, for example. Further, instead of diffusion bonding, electroforming may be used for fabrication.

[Modification]

Figure 31:
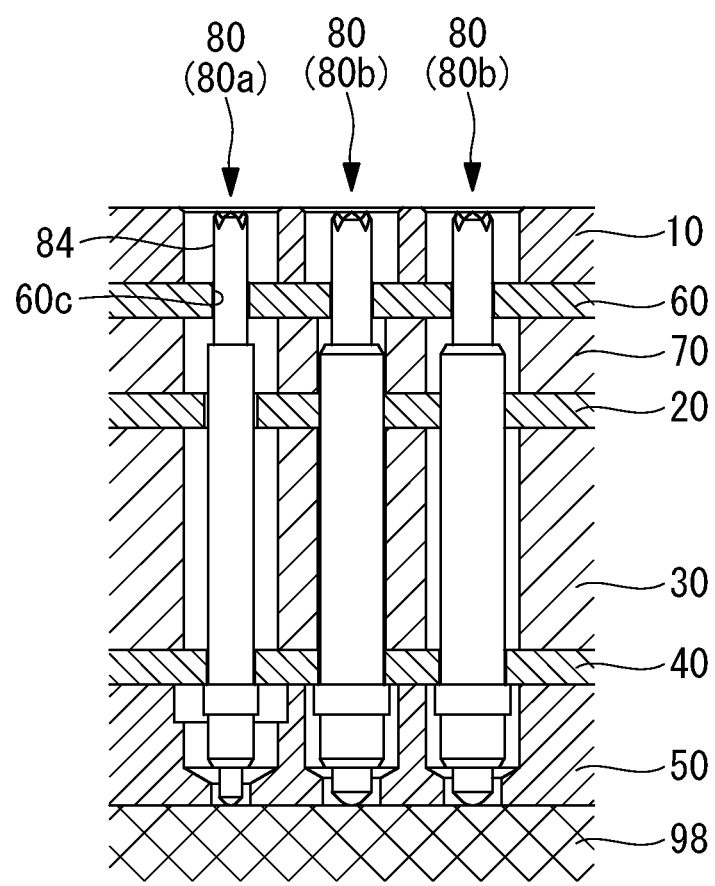
FIG. 31 is a partial vertical cross-sectional view (populated state) showing a modification of the housing.

As shown in FIG. 31, in the first to fourth embodiments, a sixth housing 60 and a seventh housing 70 may be provided between the first housing 10 and the second housing 20.

At this time, the sixth housing 60 has the same configuration as the second housing 20. However, the inner diameter of the through hole 60*c* formed in the sixth housing 60 is set slightly larger than the outer diameter of the tip side of the device-side terminal 84. The seventh housing 70 has the same configuration as the third housing 30. Note that the thickness of the seventh housing 70 is approximately equal to that of the first housing 10.

This configuration, particularly the sixth housing 60 adds a positioning spot for the device-side terminal 84. As a result, the accuracy of the position of the device-side terminal 84 can be improved and the inclination can be suppressed.

REFERENCE SIGNS LIST

1 socket (inspection socket)
3 recess
5 socket base
5*a* upper surface
5*b* bottom surface
5*c* container recess
5*d* positioning pin hole
5*e* tap
6 populating screw hole
7 housing
10 first housing (metal housing)
10*a* fixing hole
10*b* positioning pin hole
10*c* through hole
20 second housing (alignment board)
20*a* fixing hole
20*b* positioning pin hole
20*c* through hole (positioning hole)
30 third housing (metal housing)
30*a* fixing hole
30*b* positioning pin
30*c* through hole
40 fourth housing (alignment board)
40*a* fixing hole
40*b* positioning pin hole
40*c* through hole (positioning hole)
50 fifth housing (metal housing)
50*a* fixing hole
50*b* positioning pin hole
50*c* through hole
50*d* small-diameter portion
50*e* large-diameter portion
56*a* 5-1st housing (split housing)
56*b* 5-2nd housing (split housing)
56*c* 5-3rd housing (split housing)
56*d* 5-4th housing (split housing)
56*e* 5-5th housing (split housing)
56*f* 5-6th housing (split housing)
60 sixth housing (metal housing)
70 seventh housing (alignment board)
80*a*(80) first contact terminal (contact terminal)
80*b*(80) second contact terminal (contact terminal)
82 barrel
82*a* point caulking portion
82*b* one-sided caulking portion
84 device-side terminal
86 board-side terminal
88 spring
90 flange section
90*a* tapered portion
90*b* cut surface
96*a* solder ball
98 printed wiring board (inspection board)

The invention claimed is:

1. An inspection socket comprising:

a contact terminal that includes: a barrel including a tube body extending in an axial direction and a flange section where a part, extending in the axial direction, of an outer periphery of the tube body radially protrudes, a device-side terminal provided at one end of the barrel, and a board-side terminal provided at another end of the barrel;

metal housings each of which has a through hole into which the contact terminal is inserted in the axial direction, the through hole has a larger inner diameter than at least the flange section of the barrel; and a resin alignment board that has a positioning hole into which the contact terminal is inserted in the axial direction, an inner diameter of the positioning hole being larger than an outer diameter of the contact terminal excluding the flange section and smaller than an outer diameter of the flange section, wherein the metal housings are disposed, at least, on the board-side terminal side and the device-side terminal side and between the board-side terminal and the device-side terminal, the alignment board is sandwiched between the metal housings, the flange section is contained in the through hole formed in the metal housing on the board-side terminal side, and the through hole is designed to have, for impedance matching, a gap from the outer periphery of the contact terminal.

2. The inspection socket according to claim 1, wherein the flange section has a tapered portion.

3. The inspection socket according to claim 1, wherein the flange section has a cut surface having an outer diameter approximately equal to that of the barrel.

4. The inspection socket according to claim 1, wherein a portion of the gap used for impedance matching and overlapping the flange section has a larger diameter than another portion of the gap.

5. The inspection socket according to claim 1, wherein the metal housing has a plurality of split housings laminated in the axial direction.

6. The inspection socket according to claim 1, wherein the contact terminal is used for a signal line.

* * * * *